United States Patent [19]

Hallman

[11] 4,113,494
[45] Sep. 12, 1978

[54] STRUCTURE FOR PRODUCING IMAGED STRUCTURES

[75] Inventor: Robert W. Hallman, San Diego, Calif.

[73] Assignee: Energy Conversion Devices, Inc., Troy, Mich.

[21] Appl. No.: 205,861

[22] Filed: Dec. 8, 1971

[51] Int. Cl.$^2$ .................. G03C 1/94; G03C 1/52; G03C 1/80
[52] U.S. Cl. .................................. 96/75; 96/33; 101/456; 101/459; 101/462; 156/656; 156/905
[58] Field of Search .............. 96/36.2, 33, 75, 36.3; 101/456, 459, 462; 156/656, 905

[56] References Cited

U.S. PATENT DOCUMENTS

| | | | |
|---|---|---|---|
| 3,479,182 | 11/1969 | Chu | 96/33 |
| 3,639,185 | 2/1972 | Colom et al. | 96/36.2 |
| 3,682,636 | 8/1972 | Krueger | 96/33 |

Primary Examiner—William A. Powell
Assistant Examiner—Thomas Bokan
Attorney, Agent, or Firm—Wallenstein, Spangenberg, Hattis & Strampel

[57] ABSTRACT

A structure for producing images, such as microform, comprises a layer of a water soluble high molecular weight condensation product of a nitrogen compound, which is capable of giving off nitrogen upon subjecting it to energy, to form an insoluble resinous product, and thereunder a layer of an image forming material which is not soluble in water.

The imaging structure may also comprise as the image forming material a layer of a composition which contains from about 50 to 100 atomic percent, and preferably from about 80 to 100 atomic percent tellurium and extended thereover a layer of an energy sensitive material, which is capable of changing, upon subjecting it to energy, its solubility such that a latent image of soluble and insoluble areas is formed upon imagewise exposure.

The image is formed by dissolving the energy sensitive material in the areas where it has the greater solubility in one solvent and dissolving the portions of the image forming material in the areas where the energy sensitive material has been dissolved, in another solvent.

18 Claims, 4 Drawing Figures

STRUCTURE FOR PRODUCING IMAGED STRUCTURES

The present invention relates to new imaging materials and to a method for imaging and more specifically to new materials and method for making microform and lithographic plates.

For producing images such as microform, usually a layer of light sensitive material is provided on a substrate. After exposure and development, the image is formed in the layer of the light sensitive material. For contrast, the layer must be opaque, or an opaque material such as silver is precipitated in the layer, or opaqueness is achieved by introducing a dye, for instance, by the use of dye couplers, etc. The degree of opaqueness achieved by these methods is limited. This is a severe limitation, especially in microform, where due to the requirement of considerable enlargement in read-out, the best possible contrast is needed. Furthermore, these methods of the prior art for producing microform usually require rather long developing times, which is a severe handicap when large quantities of microform are to be mass produced, for instance, in a continuous machine. The time consuming development step and usually also a fixing step require complex and very expensive machinery for the mass production of microform.

As stated above, before this invention, the opaqueness or the desirable contrast in microform and other images were generally produced by or in the light sensitive layer of the imaging material. In accordance with the invention, a separate light sensitive layer is employed which does not or need not have any substantial opaqueness of its own and a separate layer of image forming material is provided, the latter providing the opaqueness or other image forming qualities. In this manner, the invention makes it possible to select the energy sensitive material solely for its sensitivity to the desired imaging energy. The image forming material needs no energy sensitivity and can be selected solely on the basis of its opaqueness or other image forming qualities and on the basis of its cost and other considerations. The present invention is therefore based on the concept of the separation of the function of energy sensitivity for the formation of a latent image and the function of the formation of the actual image by incorporating these functions in two separate layers, while they have been present for the same purpose herebefore in a single layer, as represented for instance, by the conventional silver halide material.

This independence in the selection of the energy sensitive material and of the image forming material in the imaging materials of the present invention makes it possible to provide new imaging materials, which produce highest contrast, excellent resolution and highest quality images at lowest cost. The independent choice in the selection of the most suitable energy sensitive material and of the most favorable image forming material also makes it possible to provide, for instance, for the production of microform, new materials which can be imaged and processed in the simplest manner at highest speed, making possible mass production of images, such as microform of highest quality in simple inexpensive equipment at lowest unit cost.

The imaging material in one embodiment of the invention comprises a layer of an energy sensitive material which comprises a water soluble high molecular weight condensation product of a nitrogenous compound, which is capable of giving off nitrogen when energy is applied to the layer. Thereby, the condensation product becomes water insoluble in the areas where it is subjected to the energy. The imaging material of the invention comprises furthermore a layer of an image forming material which is insoluble in water. Generally, the layers are comprised on a substrate, such that the layer comprising the image forming material is next to the substrate and the layer comprising the energy sensitive condensation product is on top. One or more intermediary layers of other materials may be located between the top layer comprising the energy sensitive material and the layer comprising the image forming material, and/or between the layer comprising the image forming material and the substrate, if such is present.

In another embodiment of the invention, the top layer of the energy sensitive material may comprise any energy sensitive material, which is capable of being changed by the application of energy between two states. In one of these states the material is readily soluble in a given solvent, while it is insoluble or of lesser solubility in the same solvent, when it is in the other state. The change between the states is usually a chemical change, i.e., a chemical reaction takes place upon the application of imaging energy, such as UV-radiation or the like, although the change may also be a physical change of the kind as occurs upon the application of energy in the so-called memory materials, for instance, of the kind described in copending application Ser. No. 143,781 filed May 17, 1971 abandoned and Ser. No. 521,955 filed Nov. 8, 1974 a continuation thereof. In this embodiment of the invention, the energy sensitive material is used for maximum performance in combination with an image forming material comprised in a separate layer and comprising a composition containing from about 50 atomic percent to 100 atomic percent tellurium and most beneficially from about 80 atomic percent to 100 atomic percent tellurium. The tellurium is contained in this composition in a non-salt form and in a non-ionic form, i.e., it may be present in elementary form or in form of an alloy or the like. Most preferred in the present invention is a layer of an imaging material which consists of or comprises elementary tellurium. Tellurium has a very high opaqueness also in very thin layers and adheres well to many substrates. It is important thereby, that the tellurium-containing composition serving as the image forming material is soluble in a solvent which is different from the solvent used for the dissolution of the soluble areas of the energy sensitive material and that it is not essentially soluble in the solvent used for the dissolution of the energy sensitive material.

Each of the layers comprising the energy sensitive material and the image forming material may be made up entirely of the respective materials, or they may contain these materials in admixture with any other desired material, such as a binder, filler, reactant, adjuvant material and so forth.

The terms "insoluble" and "soluble" as herein used are understood to be relative terms. The energy sensitive material, when it is in the insoluble state is less soluble or dissolves at a slower rate than when it is in the soluble state. This may include the situation, that the sensitive material is actually insoluble in a given solvent when it is in the insoluble state, or it may be slowly soluble when in this state, while it is readily or rapidly soluble in the same solvent when it is in the soluble state.

The present invention relates also to a method of imaging, wherein the material of the above description comprising the separate layers of energy sensitive material and image forming material is subjected imagewise to energy, thereby changing areas in said top layer comprising the energy sensitive material in such manner that a latent image is formed in the top layer of energy sensitive material, which is comprised of portions or areas of material which is soluble in a given solvent and other areas or portions of material which is insoluble in the same given solvent or which, as stated above, dissolves therein at a slower rate. The structure is thereafter treated with a solvent, which dissolves the areas of the greater solubility in the top layer of energy sensitive material, but which does not dissolve the underlying image forming material. In this manner, an intermediary structure is formed in which certain areas of the image forming material are bared. This intermediate structure is thereafter treated with a second solvent, which dissolves the image forming material in the bared areas, but which does not dissolve the energy sensitive material in the areas where it is insoluble or less soluble. In this manner, an image is formed which consists of the image forming material overlayed by the energy sensitive material, or the altered product resulting therefrom as the result of subjecting it to energy, in the areas where the latter was in a state of being insoluble or of lesser solubility. No image forming material and no energy sensitive material is in the areas where the latter material was in the soluble state. In this manner, images of highest contrast are obtained.

If desired, the portion of the insoluble energy sensitive material or of the reaction product having resulted therefrom by exposure to energy and remaining on the image forming material may be later removed, e.g., by rubbing or by the use of a third suitable solvent therefore, which of course is different from the solvents used in the first two dissolution steps and which must be a solvent, which does not dissolve or otherwise affect the image forming material.

The structures and method of the invention may be used for producing images of all kinds, including those to be read out by the human eye as well as those to be read out by physical or mechanical read-out equipment, such as those using light reflection or diffraction, electrical conductivity, magnetic properties and the like as the means for reading the image. Of course, depending on the desired manner of read-out one will select an image forming material which provides the desired physical properties such as conductivity, magnetic properties, opacity, reflectivity, etc. The materials of the invention provide an unlimited device in this respect, because of the possibility of the independent provision of the energy sensitive material and of the image forming material in separate layers.

The greatest benefit may be obtained from the invention in the use of the imaging structures and method of the invention for the production of microform, such as microfilm, microfiche etc. With the preferred image forming materials and energy sensitive materials, if used with appropriately selected solvents, dissolution times for each of these layers of two seconds or less and usually of as short as one half second or less may be readily achieved. Using correspondingly dimensioned light sources for the exposure, this makes possible cycling times of 2 seconds down to one half second or even one quarter second or less. This means, for instance, in the case of producing microfiche cards, that one card or more cards can be turned out every second. Besides a very short exposure, only the two very short dissolving steps are required, and by using the solvent sparingly, no long drying times are required. Since by the method and with the materials of the invention no separate fixing is needed, the production of microfiche can be carried out at highest production rates in the most simple and inexpensive equipement. At the above stated short cycling time of, for instance, one-quarter second, a simple, small machine can turn out more than 100,000 microfiche cards in an 8 hour working day. As will be appreciated, a machine handling precut microfiche cards by the method of the invention can be very compact. Needing only four or five stations, such machine can be of the simplest construction and can be supplied at lowest cost. In this manner, the invention of the new microform imaging materials and of the method provides a great step forward in the art of making microform. Similar benefits may, of course, also be achieved, if the materials of the invention are used in form of continuous rolls of film or the like. The same benefits are also achieved for the production of images other than microfiche.

The materials and method of the invention may also be used with great benefit for the production of new improved lithographic printing plates. In this case, a hydrophilic substrate is selected, preferably aluminum and most beneficially pretreated hydrophilic aluminum. The image forming material and the energy sensitive material are selected such that the respective layers containing them are oleophilic. Tellurium and the above mentioned tellurium containing compositions were found to be most excellently suited as the oleophilic imaging material in the production of the lithographic printing plates of the invention especially, if aluminum is used on the hydrophillic substrate.

Microform or other images produced from the materials and by the method of the invention have a higher contrast than is generally obtainable with materials conventionally used for this purpose. The new materials provide a very excellent resolution and sharpness. In some cases the sharpness and resolution may be increased over that of the original due to high gamma. In this respect reference is made to the description of the reasons and mechanisms for the increase of resolution and sharpness set out in the copending application Ser. No. 205,860, filed Dec. 8, 1971, entitled "Structure and Method For Producing Microform" abandoned and Ser. No. 359,717 a continuation-in-part thereof, now U.S. Pat. No. 3,944,357. The materials of the invention have a very high gamma and exceed in this respect the best available silver halide materials and are in this respect also far superior to the diazo materials presently used for microform production.

The lithographic printing plates of the invention represent a great step forward in the art of making printing plates. The fast cycling times possible by the method of the invention shorten the preparation time and make possible printing within seconds from the time of imaging. They provide highest differential between oleophilic and hydrophilic areas, especially if the undissolved energy sensitive material is removed in a subsequent step as set out hereinbefore. The lithographic printing plates of the invention have a very long life and are suitable for long runs and most important, they may be used with conventional fountain solution and litho inks.

Other objects, advantages and features of the invention will become apparent to those skilled in the art from the following description and claims of the invention and from the attached drawings in which:

Figure 1:
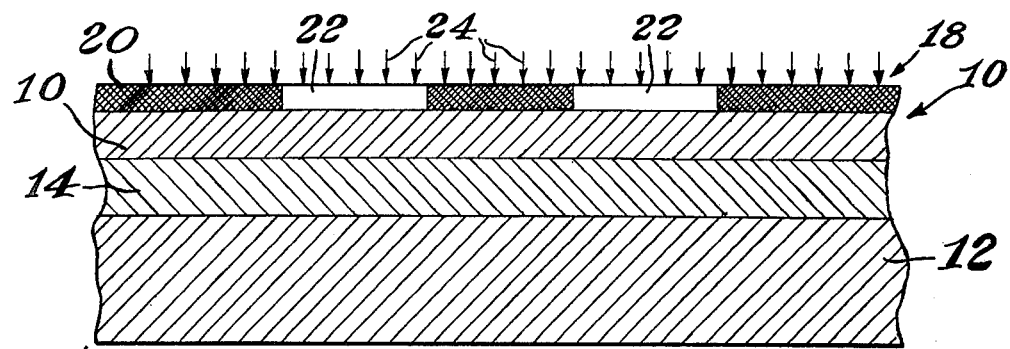
FIG. 1 is a schematic fragmentary cross-sectional representation of a structure of the invention being subjected to electromagnetic radiation through a mask.

Referring to the drawings, the imaging structure 10 in FIG. 1 comprises a substrate 12, which may be for instance glass, Mylar or cellulose acetate. On the substrate 12 is disposed a layer 14 of an image forming material, such as tellurium. On layer 14 is disposed a layer 16 of an energy sensitive material, such as Diazo Resin No. 4, made and sold by Fairmount Chemical Company. This material is a high molecular weight condensation product of a diazonium compound and is soluble in water. It may therefore be applied to the structure in form of an aqueous solution, e.g., by roller coating. After drying of the coated energy sensitive layer 16, the structure 10 is ready for imaging.

A mask 18 is shown placed on top of the structure 10. The mask comprises opaque areas 20 and light transmissive areas 22. Electromagnetic radiation 24, such as radiation comprising a considerable proportion of UV radiation, is shown falling onto the mask 18 and through transparent areas 22 of the mask 18 onto the layer 16 of the energy sensitive material. In the selected example, the energy sensitive material underlying light transmissive areas 22, which was originally water soluble, becomes under the effect of radiation 24 water insoluble to form areas 26 (FIG. 2) of material, which is insoluble in aqueous media. In the case of Diazo Resin No. 4, nitrogen is given off under the effect of the radiation, and a resin is formed, which is insoluble in most any aqueous liquid. In areas 28, which were covered by the opaque portions 20 of the mask 18 the energy sensitive material has remained water soluble. The structure thus altered is shown in FIG. 2 with the mask removed.

Figure 2:
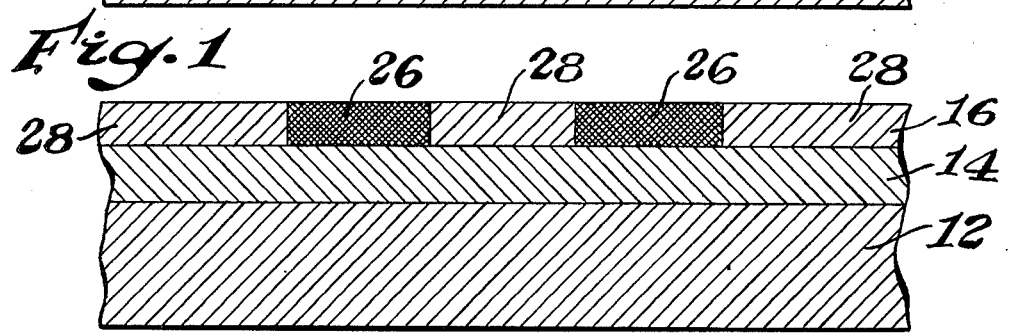
FIG. 2 is similar to FIG. 1, showing the mask removed and selected areas of the top layer changed by the irradiation.
Figure 3:
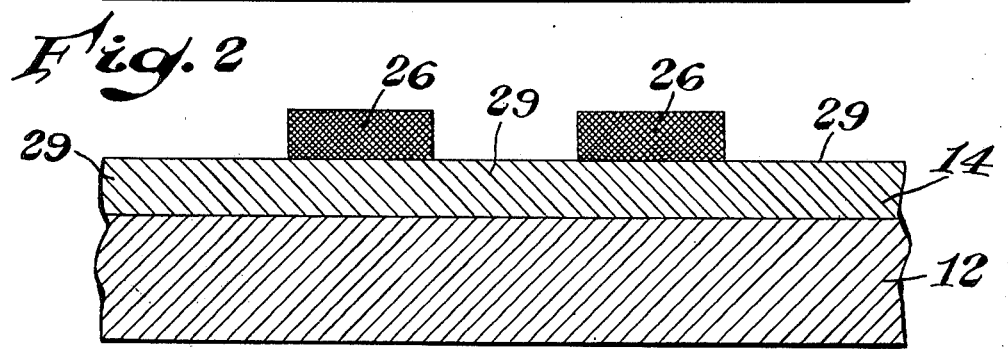
FIG. 3 is similar to FIG. 2, showing the structure after the treatment in a first dissolution step.
Figure 4:
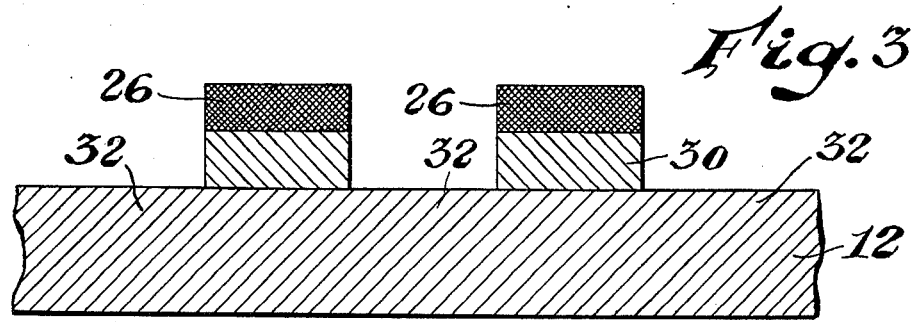
FIG. 4 is similar to FIG. 3, showing the structure after the treatment in a second dissolution step.

The structure shown in FIG. 2 is thereafter dipped into water or its surface is wiped with water, e.g., contained in a sponge, in a moving belt made of felt or the like. This results in the instantaneous dissolution of the water soluble portions of the energy sensitive material in areas 28 to result in the structure shown in FIG. 3. The structure of FIG. 3 is thereafter dipped into or its surface is wiped with a solution of a solvent for the image forming material in layer 14. If the latter is tellurium or a composition high in tellurium content, the solvent used may be an oxidizing agent, such as an aqueous solution of sodium hypochlorite, a solution of bromine in ethanol or a very dilute aqueous solution of hydrogen peroxide or the like solvent for the tellurium layer. If other image forming materials are used in layer 14, one will select a respective solvent, which dissolves the image forming material, but not the water insoluble phase of the energy sensitive material. The treatment in such second solvent instantly removes the image forming material in the areas 29 where it lies bare and where the energy sensitive material in the areas 28 (FIG. 3) has been removed to result in the structure shown in FIG. 4. If substrate 12 is light transmissive, the image formed in this manner is a transparency formed by the opaque areas 30 of the image forming material and by the light transmissive areas 32 of the substrate 12. If the substrate 12 is a hydrophilic material, such as an aluminum foil or aluminum plate, the image is a lithographic printing plate comprised of oleophilic areas 26 and hydrophilic areas 32. In the drawing the thickness of the layer and substrate has been greatly exaggerated. In practice, extremely thin layers, as will be set out hereinafter are sufficient for making excellent transparencies or lithographic plates.

The energy sensitive materials useful in the structures and method of the invention may be water soluble diazonium resins of any kind and especially high molecular weight condensation or addition products of diazonium or other nitrogen compounds, which under the effect of energy become water insoluble. Generally, all those water soluble materials may be used in the present invention, which are listed in the above mentioned copending application Ser. No. 205,860. Similarly, the image forming material may be selected from the listing of materials as contained in said copending application, with the limitations and in the combinations as set out hereinbefore. In the structures and method of the present invention, tellurium, molybdenum and the various tellurium compositions listed in said copending application were found to be the preferred image forming materials. This applies particularly also in the embodiment of the present invention where the substrate is a hydrophilic material to form the above mentioned lithographic plates.

Intermediary layers between the energy sensitive material and the image forming material and/or between the image forming material and the substrate, if such is present, may be used in a manner as described in the above said copending application Ser. No. 205,860.

Many more modifications may be made in the present invention and special reference is made in this respect to the above said copending application Ser. No. 205,860, which herewith is made part of the disclosure and description of the present invention.

What is claimed is:

1. An imaging material comprising: a layer comprising a thin film of an energy sensitive high molecular weight condensation product of a nitrogen containing compound which is soluble in a first solvent and which upon the application of energy thereto is capable of giving off nitrogen thereby becoming insoluble in said first solvent; and a layer comprising a thin film of an image forming material, which is soluble in a second solvent and not soluble in said first solvent, the film of the condensation product and the film of the image forming material and the thinnesses thereof being such that the change in state of the condensation product upon the application of energy thereto and the dissolution by said second solvent of the image forming material in the areas where the condensation product has not undergone a change in state, can, together, take place in substantially less than 1 minute to provide an imaged product.

2. The imaging material of claim 1, in which said energy sensitive high molecular weight condensation product is a condensation product of a diazonium compound.

3. The imaging material of claim 1, in which said energy sensitive high molecular weight condensation product is a condensation product of an aromatic diazonium compound.

4. The imaging material of claim 2, in which said energy sensitive condensation product is a formaldehyde condensation product of a diazonium compound.

5. The imaging material of claim 1, in which said energy sensitive condensation product is Diazo Resin No. 4.

6. The imaging material of claim 1, in which said image forming material is a non-metallic material.

7. The imaging material of claim 1, in which said image forming material is a material, which is readily soluble in a non-obnoxious solvent.

8. The imaging material of claim 1, in which said image forming material is a memory material.

9. The imaging material of claim 1, in which said image forming material is a composition from about 50 atomic percent to 100 atomic percent tellurium.

10. The imaging material of claim 1, in which said energy sensitive condensation product is soluble in water.

11. The imaging material of claim 1, in which said image forming material is soluble in liquid medium, which contains an oxidizing agent.

12. The imaging material of claim 1, in which said layer comprising the image forming material is contained on a substrate.

13. The imaging material of claim 1, in which said image forming material is a composition composed substantially of molybdenum.

14. An imaging material comprising: a layer comprising a thin film of an energy sensitive material which is capable of changing upon the application of energy between two states, one of which is a state in which the material is soluble in a first solvent, the other being a state in which the material is not soluble in said first solvent; and a layer comprising as an image forming material a thin film of an opaque tellurium composition which comprises from about 50 atomic percent to 100 atomic percent tellurium and which is soluble in a second solvent, but not soluble in said first solvent, the film of energy sensitive material and the film of the tellurium composition and the thinnesses thereof being such that the change in state of the energy sensitive material upon the application of energy thereto and dissolution by said second solvent of the tellurium composition in the areas where the energy sensitive material has not undergone a change in state, can, together, take place in substantially less than 1 minute to provide an imaged product.

15. The imaging material of claim 14, in which said image forming material comprises a tellurium composition which contains from about 80 atomic percent to 100 atomic percent tellurium.

16. The imaging material of claim 14, in which the energy sensitive material comprises a compound which changes, upon the application of energy from one chemical composition to another chemical composition, said compounds of different composition having a substantially different solubility in said first solvent, which is not a solvent for said tellurium containing image forming material.

17. The imaging material of claim 14, in which the energy sensitive material is a photo-sensitive material.

18. The imaging material of claim 14, in which the energy sensitive material is a water soluble diazonium compound, which upon the application of energy becomes water insoluble.

* * * * *